US012750010B2

(12) United States Patent
Mellor et al.

(10) Patent No.: US 12,750,010 B2
(45) Date of Patent: Sep. 29, 2026

(54) GROUP III NITRIDE Doherty AMPLIFIER USING DIFFERENT EPITAXIAL STRUCTURES

(71) Applicant: MACOM Technology Solutions Holdings, Inc., Lowell, MA (US)

(72) Inventors: Matthew Mellor, Hollister, CA (US); Damon Holmes, Scottsdale, AZ (US); David Rice, Hollister, CA (US); Mike Lu, Gilroy, CA (US); Simon Wood, Morgan Hill, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 537 days.

(21) Appl. No.: 18/213,682

(22) Filed: Jun. 23, 2023

(65) Prior Publication Data

US 2024/0429870 A1 Dec. 26, 2024

(51) Int. Cl.
*H03F 1/02* (2006.01)
*H03F 3/21* (2006.01)
(Continued)

(52) U.S. Cl.
CPC ............ *H03F 1/0288* (2013.01); *H03F 3/21* (2013.01); *H10D 30/475* (2025.01);
(Continued)

(58) Field of Classification Search
CPC .......... H03F 1/0288; H03F 3/21; H03F 3/245; H03F 3/195; H10D 30/475;
(Continued)

(56) References Cited

U.S. PATENT DOCUMENTS 9,997,476 B2 6/2018 Zhang et al.
10,250,197 B1 * 4/2019 Schultz ................ H03F 1/0288
(Continued)

FOREIGN PATENT DOCUMENTS

| | | | | |
|---|---|---|---|---|
| WO | 2020197852 A1 | | 10/2020 | |
| WO | WO-2021262538 A1 | * | 12/2021 | .......... H10W 90/811 |
| WO | 2023034078 A1 | | 3/2023 | |

OTHER PUBLICATIONS

The Doherty Amplifier, Bumman Kim et al., IEEE Microwave Magazine, pp. 42-50, Oct. 2006 (Year: 2006).*

*Primary Examiner* — S M SOHEL Imtiaz
(74) *Attorney, Agent, or Firm* — Davis Hartman Wright LLP; William G. Pagán

(57) ABSTRACT

A Doherty amplifier comprises a main amplifier and a peaking amplifier. The main amplifier and the peaking amplifier are electrically connected to a same input signal source. The main amplifier and the peaking amplifier comprise different epitaxial structures of a Group III nitride material. To form the Doherty amplifier, the main amplifier and the peaking amplifier are formed comprising Group III nitride transistors comprising different epitaxial structures from different epiwafers such that the Group III nitride transistors of the main and peaking amplifiers comprise different epitaxial structures. The wafers are diced to produce respective amplifier dies comprising the main amplifier and peaking amplifier, respectively. The amplifier dies are mounted on a common heat sink, and the main and peaking amplifiers are electrically connected to the input signal source.

4 Claims, 7 Drawing Sheets

(51) Int. Cl.
*H10D 30/47* (2025.01)
*H10D 62/85* (2025.01)
*H10D 64/00* (2025.01)
*H10W 20/20* (2026.01)
*H10W 20/40* (2026.01)
*H10W 90/00* (2026.01)

(52) U.S. Cl.
CPC ....... *H10D 62/8503* (2025.01); *H10D 64/111* (2025.01); *H10W 20/20* (2026.01); *H10W 20/484* (2026.01); *H10W 90/00* (2026.01)

(58) Field of Classification Search
CPC .. H10D 62/8503; H10D 64/111; H10D 30/47; H10W 20/20; H10W 20/484; H10W 90/00
See application file for complete search history.

(56) References Cited

U.S. PATENT DOCUMENTS

| | | | | |
|---|---|---|---|---|
| 10,594,276 | B2 | 3/2020 | Jones et al. | |
| 2017/0125362 | A1* | 5/2017 | Zhang | H10W 44/20 |
| 2020/0014342 | A1* | 1/2020 | Jones | H03F 1/0288 |
| 2021/0320625 | A1* | 10/2021 | Hashinaga | H03F 1/0288 |
| 2021/0398971 | A1* | 12/2021 | Som | H10D 84/40 |
| 2022/0102294 | A1 | 3/2022 | Zhao et al. | |
| 2023/0308062 | A1* | 9/2023 | Kobayashi | H04B 1/04 |
| 2024/0355619 | A1* | 10/2024 | Linthicum | H03F 1/0288 |

* cited by examiner

GROUP III NITRIDE Doherty AMPLIFIER USING DIFFERENT EPITAXIAL STRUCTURES

BACKGROUND

A High Electron Mobility Transistor (HEMT) is a type of Field Effect Transistor (FET) having a low noise figure at microwave frequencies. HEMTs are used in Radio Frequency (RF) circuits, as both digital switches and current amplifiers, where high performance is required at very high frequencies. HEMTs employ a heterojunction—a junction between materials with different band gaps. HEMTs have been fabricated with several materials, including Silicon (Si); Gallium Arsenide (GaAs) and Aluminum Gallium Arsenide (AlGaAs); and Gallium Nitride (GaN) and Aluminum Gallium Nitride (AlGaN).

Si has a relatively low electron mobility (e.g., 1450 cm2/V-s). This produces a high source resistance, which limits the HEMT gain. GaAs has a higher electron mobility (e.g., 6000 cm2/V-s), and hence lower source resistance, allowing for higher gain at high frequencies. However, GaAs has a bandgap of only 1.42 eV at room temperature, and a small breakdown voltage, which limits high power performance at high frequencies.

Group III nitrides have a larger bandgap as compared to these other semiconductor materials and are thereby suitable for higher power and higher frequency applications. While GaN is of particular interest, in general, a Group III nitride heterojunction for a HEMT may be formed from a binary, ternary, or quaternary alloy of Group III metals and Nitrogen. This formulation may be expressed as AlxlnyGa1-x-yN, where 0<=x<=1 and 0<=y<=1—that is, any combination of some or all of Aluminum, Indium, and Gallium alloyed with Nitrogen. In particular, the density of the various alloys may be altered to control the properties of the semiconductor. For example, Aluminum increases the bandgap of GaN, while Indium reduces it.

GaN has a bandgap of 3.36 eV and a relatively high electron mobility (e.g., 2019 cm2/V-s). GaN HEMTs thus offer high power and high temperature operation at high frequencies, making them well suited for applications in wireless telecommunications, RADAR, defense, and other applications. In a GaN HEMT, a heterojunction is formed at the boundary of layers of GaN and, e.g., AlGaN. As used herein, AlGaN is an abbreviation for the formula AlxGa1-xN, 0≤x≤1, meaning the concentration of Al in the alloy may be varied. Layers of AlGaN may also be graded, with the concentration of Al atoms in the lattice varying as a function of depth.

At the heterojunction between GaN and AlGaN layers, the difference in bandgap energies between the higher bandgap AlGaN and the GaN creates a two-dimensional electron gas (2DEG) in the smaller bandgap GaN, which has a higher electron affinity. The 2DEG has a very high electron concentration. Additionally, the Al content in the AlGaN layer creates a piezoelectric charge at the interface, transferring electrons to the 2DEG in the GaN layer, enabling a high electron mobility. For example, sheet densities in the 2DEG of a AlGaN/GaN HEMT can exceed 1013 cm-2. The high carrier concentration and high electron mobility in the 2DEG create a large transconductance, yielding high performance for the HEMT at high frequencies.

In practical applications, GaN HEMTs require a variety of circuits, comprising various components such as capacitors, inductors, and resistors. For example, HEMTs employed as amplifiers generally require RF filters at the amplifier input, output, or both, to optimize operation of the amplifier in desired frequency ranges, provide impedance matching to connected circuits, and the like.

One particular type of amplifier is known as a Doherty amplifier. An example of a Doherty amplifier 10 is represented schematically in FIG. 1. The Doherty amplifier 10 comprises a power divider 12, a phase shifter 14, input matching stages 16*a*, 16*b*, first and second transistors 18*a*, 18*b*, output matching stages 20*a*, 20*b*, an impedance inverter 22, and a transformer 24.

The power divider 12 divides an RF input signal ($RF_{IN}$) into a first signal and a second signal (e.g., using a quadrature coupler). The first transistor 18*a* operates on the first signal and is used for most signal amplification. In this regard, the first transistor 18*a* is often referred to as a “main” or “carrier” amplifier stage. The second transistor 18*b* operates on the second signal and is used to amplify signal peaks. Accordingly, the second transistor 18*b* is often referred to as an “auxiliary” or “peak” amplifier stage. The more general terms “first” and “second” amplifier are used herein.

A feature of the Doherty amplifier is the output connection of the first and second amplifiers, which is made through an impedance inverter 22, often implemented using a quarter-wavelength transmission line, and often having a 90-degree phase shift. At low input signal power levels, the second amplifier is inactive, and is effectively an open circuit. The system impedance is reduced at the output of the second amplifier due to the output matching network 24. This impedance is inverted to a much higher impedance by the impedance inverter 22, presenting a high output impedance to the first amplifier 18*a*, improving its efficiency. As the second amplifier begins to amplify signal peaks, its increasing output current (summed with the output current of the first amplifier) increases the voltage across the load impedance, which the impedance inverter 22 presents to the first amplifier as a decreasing impedance. The lower impedance allows the first amplifier output power to increase as the input signal power increases. This is known as load modulation, and it results in the Doherty amplifier 10 exhibiting high efficiency across the full range of input signal power.

Efficient and effective construction of Doherty amplifiers is of interest for optimizing performance. Among other things, simplifying the fabrication of integrated circuits and increasing their yield and reliability may lead to cost reduction and higher integration. In order to increase reliability and simplicity, the main amplifier and peaking amplifier are traditionally constructed using the same fabrication process (e.g., using dies cut from the same wafer), as this tends to reduce variation between the amplifiers.

The Background section of this document is provided to place embodiments of the present invention in technological and operational context, to assist those of skill in the art in understanding their scope and utility. Approaches described in the Background section could be pursued but are not necessarily approaches that have been previously conceived or pursued. Unless explicitly identified as such, no statement herein is admitted to be prior art merely by its inclusion in the Background section.

BRIEF SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

Embodiments of the present disclosure generally relate to a Doherty amplifier that includes amplifier dies having different epitaxial structures. For example, the amplifier dies may be dies from different Group III nitride epiwafers and having different epitaxial structures). This contrasts with traditional Doherty amplifiers that include amplifier dies that, e.g., are produced using the same epitaxial structure, typically from the same epiwafer, to reduce variation even more.

In particular, one or more embodiments include a Doherty amplifier comprising a main amplifier and a peaking amplifier that are electrically connected to a same input signal source and comprise different epitaxial structures of a Group III nitride material.

In some embodiments, the epitaxial structure of the peaking amplifier provides the peaking amplifier with a higher power density than the epitaxial structure of the main amplifier.

In some embodiments, the epitaxial structure of the main amplifier provides the main amplifier with a higher gain than the epitaxial structure of the peaking amplifier.

In some embodiments, the epitaxial structure of the main amplifier provides the main amplifier with a higher transconductance than the epitaxial structure of the peaking amplifier.

In some embodiments, the epitaxial structure of the peaking amplifier enables the peaking amplifier to have a higher maximum current than the epitaxial structure of the main amplifier.

In some embodiments, the epitaxial structure of the main amplifier provides the main amplifier with more linear amplification than the epitaxial structure of the peaking amplifier. In some embodiments, the Group III nitride material comprises ALGaN.

In some embodiments, the epitaxial structure of the main amplifier and the peaking amplifier comprise different polarities. In some such embodiments, the different polarities comprise GaN-polar, Nitrogen-polar, and/or semipolar.

In some embodiments, the main amplifier and/or the peaking amplifier further comprises a dielectric interlayer.

Other embodiments are directed to a method of forming a Doherty amplifier. The method comprises forming a main amplifier and a peaking amplifier comprising Group III nitride transistors comprising different epitaxial structures from different epiwafers such that the Group III nitride transistors of the main amplifier and peaking amplifier comprise different epitaxial structures. The method further comprises dicing the epiwafers to produce respective amplifier dies comprising the main amplifier and peaking amplifier, respectively. The method further comprises mounting the amplifier dies on a common heat sink. The method further comprises electrically connecting the main amplifier and the peaking amplifier to a common input signal source.

In some embodiments, the epitaxial structure of the peaking amplifier provides the peaking amplifier with a higher power density than the epitaxial structure of the main amplifier.

In some embodiments, the epitaxial structure of the main amplifier provides the main amplifier with a higher gain than the epitaxial structure of the peaking amplifier.

In some embodiments, the epitaxial structure of the main amplifier provides the main amplifier with a higher transconductance than the epitaxial structure of the peaking amplifier.

In some embodiments, the epitaxial structure of the peaking amplifier enables the peaking amplifier to have a higher maximum current than the epitaxial structure of the main amplifier.

In some embodiments, the epitaxial structure of the main amplifier provides the main amplifier with more linear amplification than the epitaxial structure of the peaking amplifier.

In some embodiments, the Group III nitride material comprises AlGaN.

In some embodiments, the epitaxial structure of the main amplifier and the peaking amplifier comprise different polarities. In some such embodiments, the polarities comprise GaN-polar, Nitrogen-polar, and/or semipolar.

In some embodiments, the main amplifier and/or the peaking amplifier further comprises a dielectric interlayer.

Of course, those skilled in the art will appreciate that the present embodiments are not limited to the above contexts or examples and will recognize additional features and advantages upon reading the following detailed description and upon viewing the accompanying drawings.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

Figure 1:
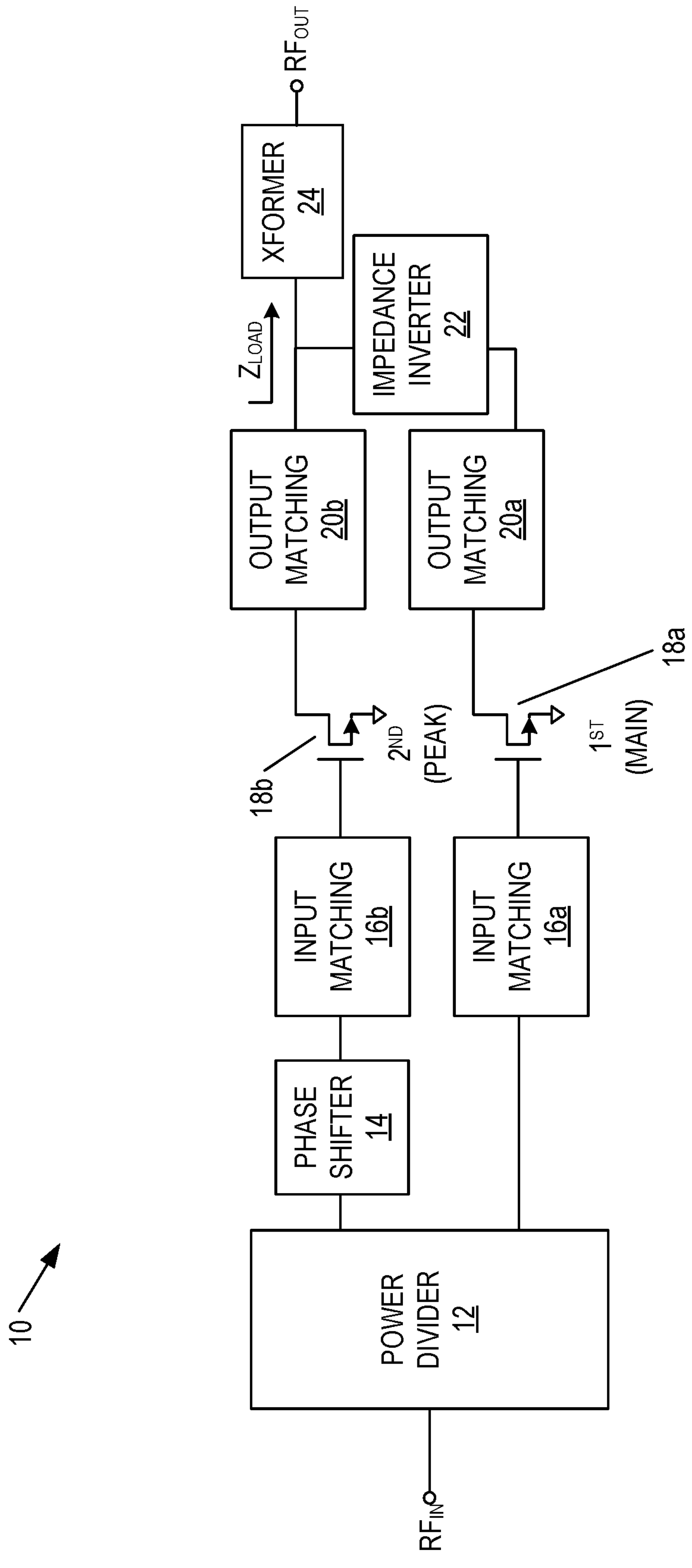
FIG. 1 (PRIOR ART)
FIG. 1 is a block diagram showing an example of a Doherty amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the figures. It will be understood that these terms and those discussed above are intended to encompass different orientations of the device in addition to the orientation depicted in the figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
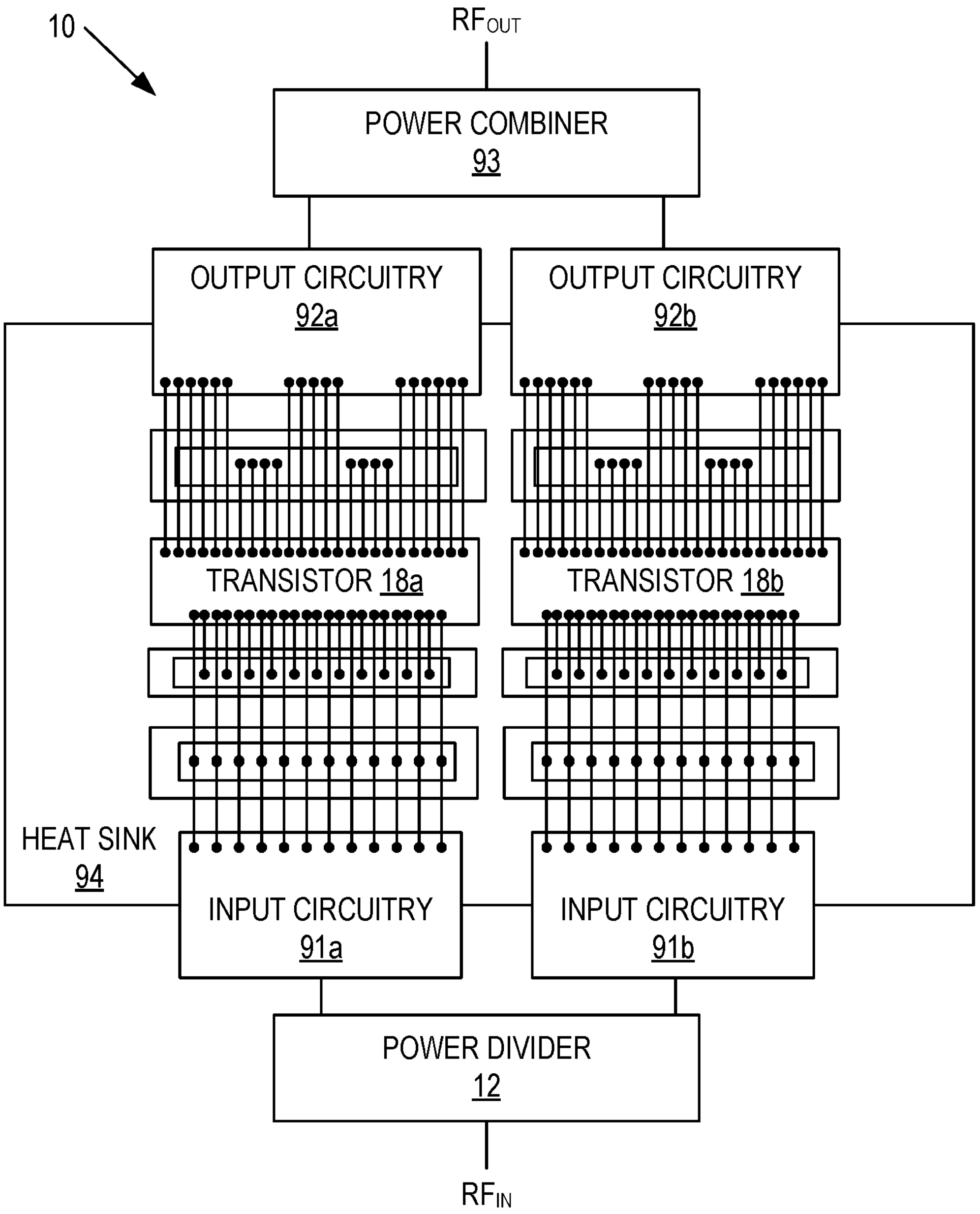
FIG. 2 is a block diagram showing an example of a Doherty amplifier according to one or more embodiments of the present disclosure.

FIG. 2 illustrates a simplified example of a Doherty amplifier according to one or more embodiments of the present disclosure. As shown in FIG. 2, a first amplifier and a second amplifier (i.e., transistors 18*a*, 18*b*) are mounted onto a common heat sink 94. According to some embodiments, the approximate dimensions of each amplifier are 1-6 mm by 0.8-1.4 mm. Each amplifier is connected (e.g., by bondwires, as shown) to respective input circuitry 91*a*, 91*b*. Either or both of the input circuitry 91*a*, 91*b* may comprise, for example, a phase shifter 14, an input matching stage 16, and/or harmonic termination circuitry. Additionally, it should be understood that the amplifiers may comprise single or multiple stages of transistors 18. Additionally, the Doherty amplifier can comprise multiple peaking paths with additional transistors. In this embodiment, for simplicity, the amplifiers are each shown as a single stage of transistors 18*a*, 18*b*.

Each of the input circuitry 91*a*, 91*b* is provided with an input signal by a power divider 12 that is connected to an input signal source providing an RF input signal ($RF_{IN}$).

Each of the transistors 18*a*, 18*b* is connected (e.g., by bondwires, as shown) to a respective output circuitry 92*a*, 92*b*. Either or both of the output circuitry 92*a*, 92*b* may comprise an output matching stage 20 and/or harmonic termination circuitry, for example. Each of the output circuitry 92*a*, 92*b* provides a respective signal to a power combiner 93 that combines the output signals and produces a combined RF output signal ($RF_{OUT}$) of the Doherty amplifier 10. According to some embodiments, each of the transistors 18*a*, 18*b* uses a same drain bias voltage of 50V. That said, the transistors 18*a*, 18*b* may, in some embodiments have different maximum current capabilities, e.g., due to having been constructed comprising Group III nitride transistors comprising different epitaxial structures and/or using different wafer manufacturing processes. For example, the Doherty amplifier 10 may comprise respective dies for the transistors 18*a*, 18*b* that are cut from different Group III nitride epiwafers comprising different epitaxial structures.

Although FIG. 2 only shows a first amplifier 18*a* and a second amplifier 18*b*, it should be understood that other examples of a Doherty amplifier 10 may include one or more further amplifiers. Each further amplifier may operate as an additional peaking amplifier that is configured to amplify signal peaks. Each further amplifier may be implemented in similar fashion to the second amplifier 18*b*, accepting the same input signal from the input signal source and having its output power combined with the other output signals at power combiner 93.

Figure 3A:
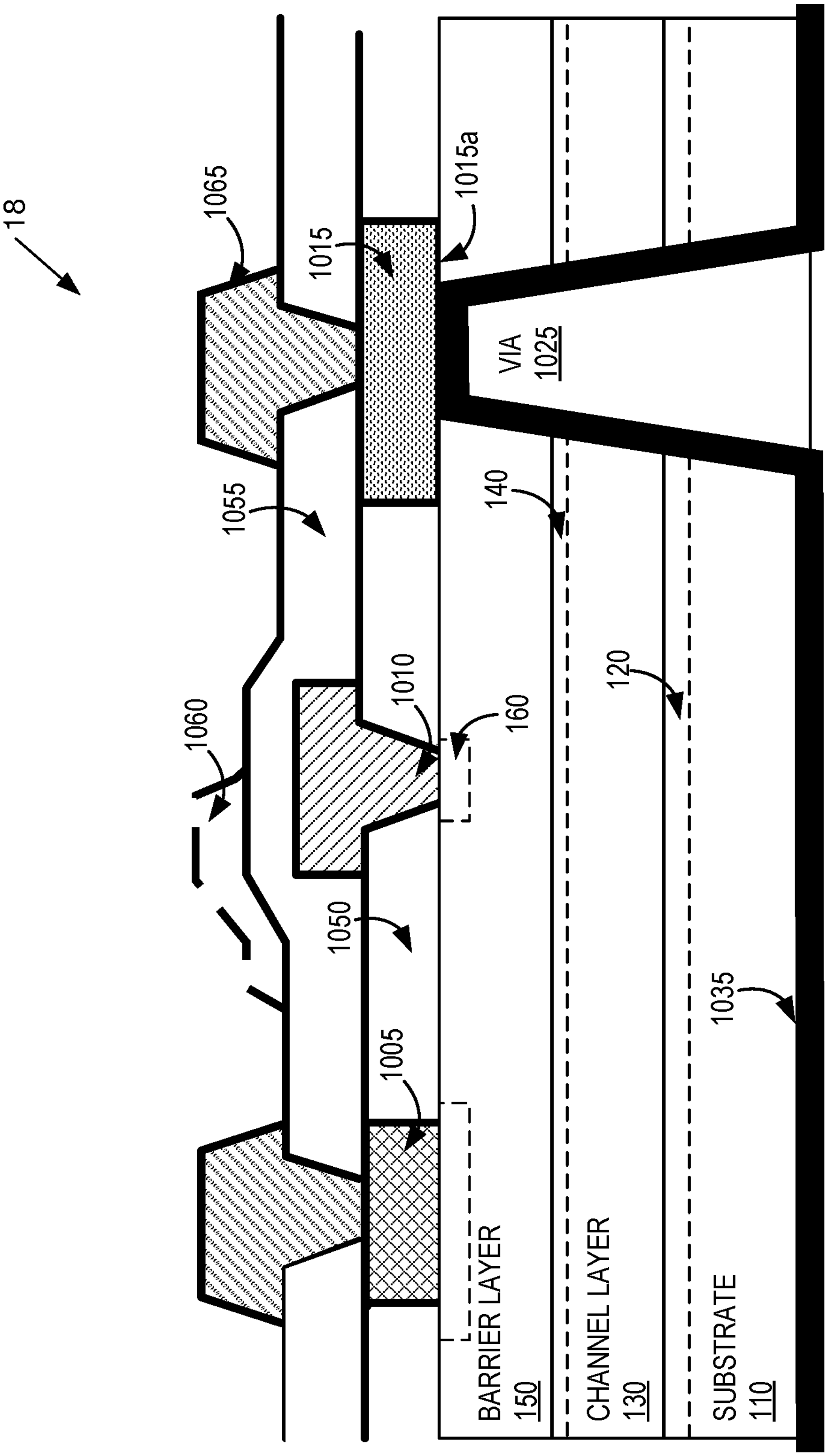
FIGS. 3A-C are schematic side views illustrating examples of Group III-nitride transistors comprising different epitaxial structures according to one or more embodiments of the present disclosure.
Figure 3B:
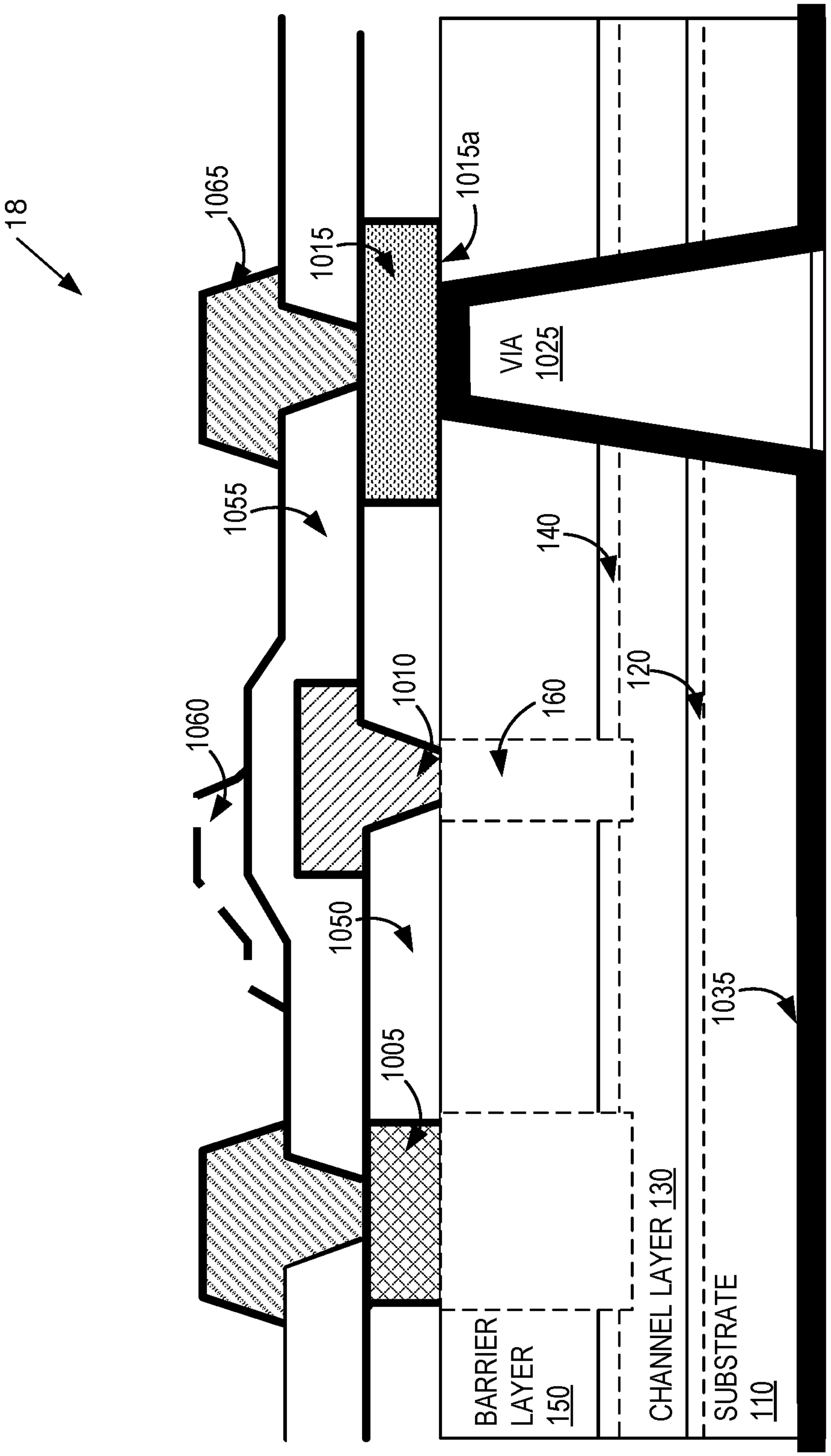
Figure 3C:
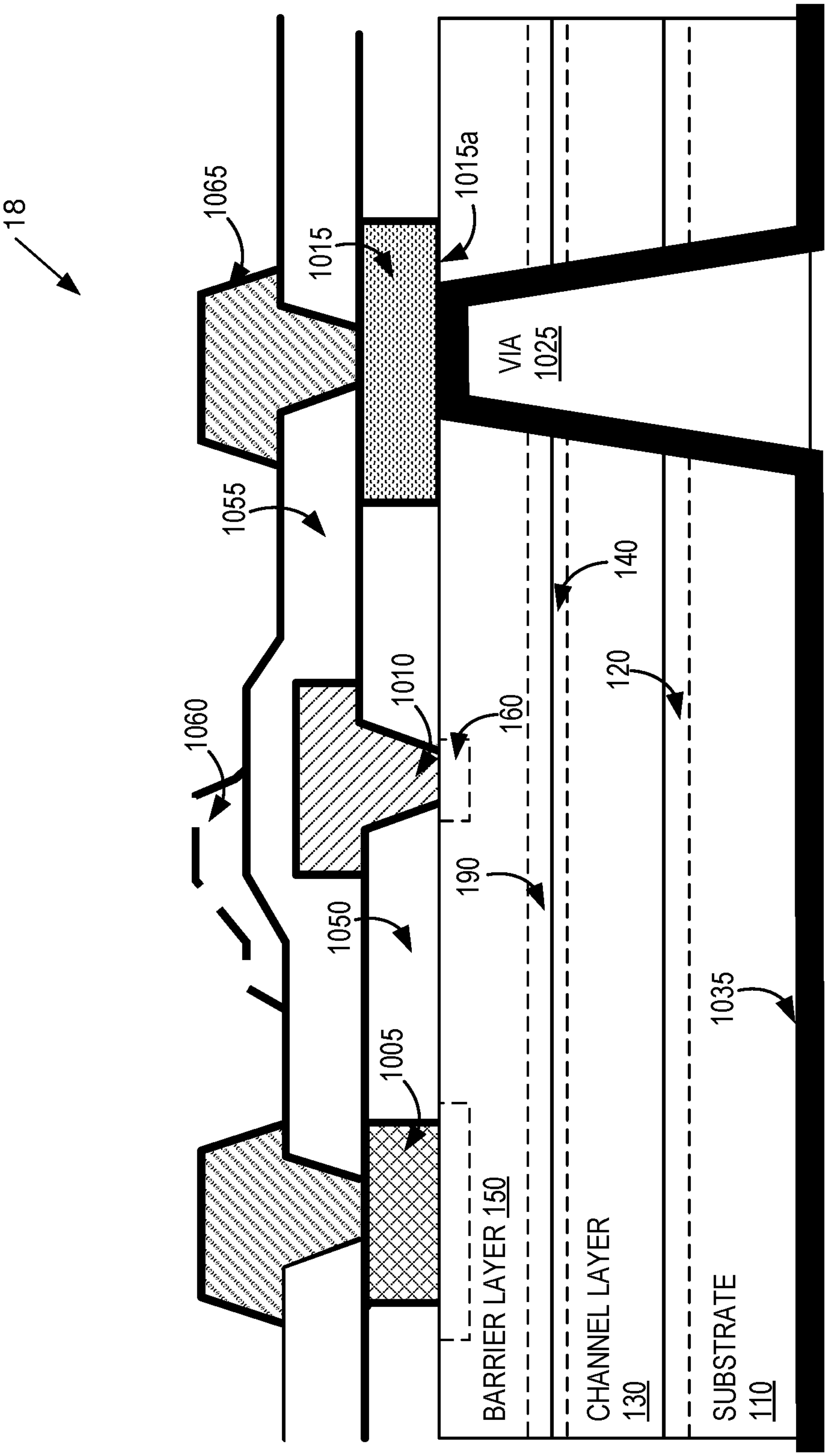
Figure 4:
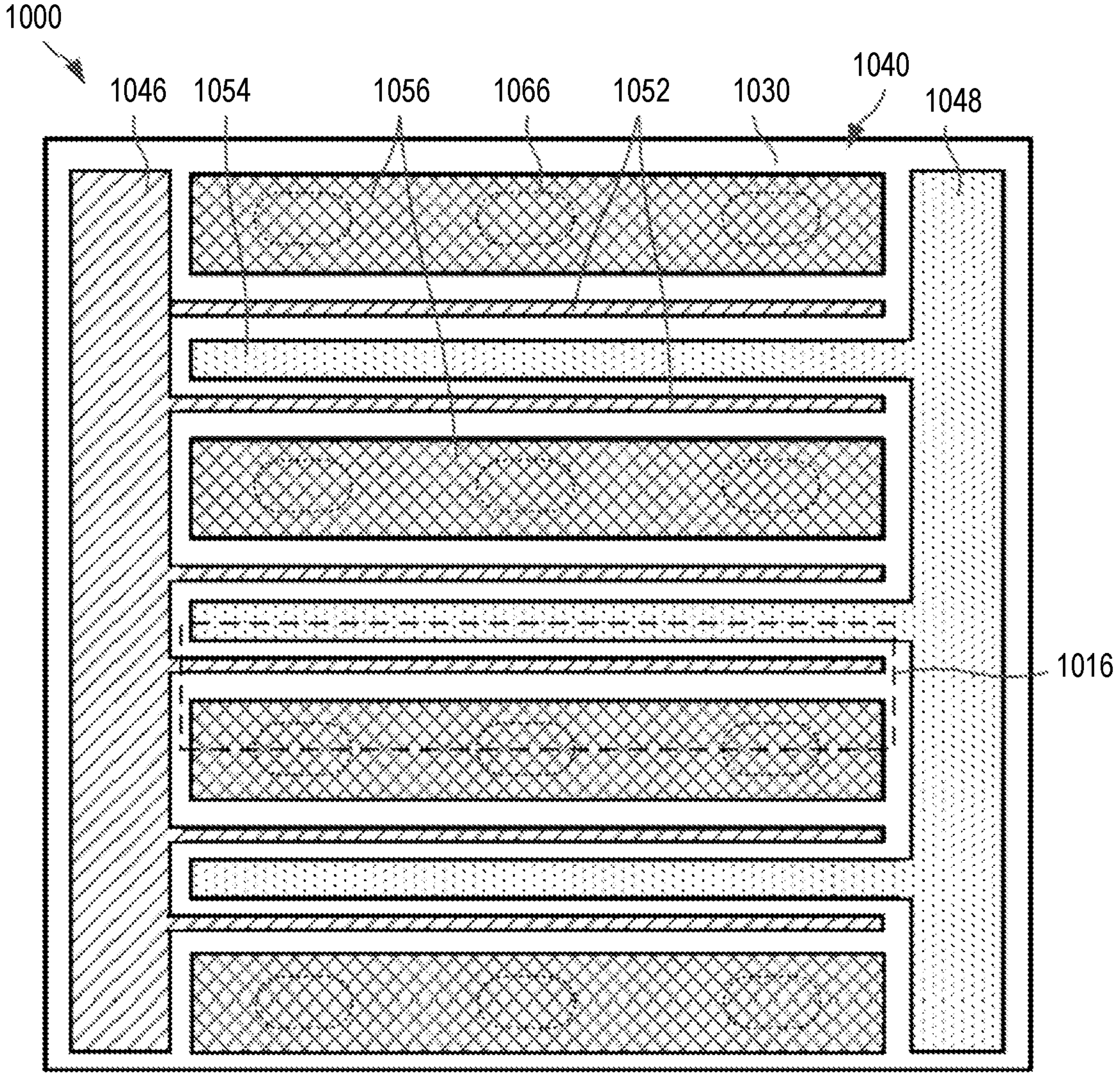
FIG. 4 is a schematic top view of a Group III-Nitride transistor according to one or more embodiments of the present disclosure.

FIG. 3A schematically illustrates an example cross section of a Group III-nitride HEMT or transistor 18 according to one or more embodiments of the present disclosure. The transistor 18 comprises a substrate 110 formed, for example, from Silicon Carbide (SiC), silicon, or sapphire. Indeed, embodiments of the present application may utilize any suitable substrate. For example, the substrate 110 may be formed from a SiC wafer on which many transistors 18 are formed on the wafer. The wafer is then singulated into individual dies. It will be understood that each transistor 18 depicted in FIGS. 3A-C is a unit cell of a die in which multiple unit cells are formed in parallel and diced to form individual transistor die as shown in FIG. 4 discussed below.

The transistor 18 may further comprise a nucleation layer 120 deposited on the substrate 110. The nucleation layer 120 may, for example, be formed from Aluminum Nitrate (AlN).

The transistor 18 further comprises a channel layer 130 of GaN deposited on the nucleation layer 120 (or, alternatively, directly on the substrate 110). The amplifier 18 further comprises a barrier layer 150 deposited on the channel layer 130. The barrier layer 150 may comprise, e.g., GaN alloyed with Aluminum (AlGaN).

At the boundary of the channel layer 130 and barrier layer 150, a heterojunction is formed. The difference in bandgap energies between the higher bandgap AlGaN and the lower bandgap GaN creates a two-dimensional electron gas (2DEG) 140 in the GaN, which has a higher electron affinity. Additionally, the Al content in the AlGaN layer creates a piezoelectric charge at the interface, transferring electrons to the 2DEG 140 in the GaN layer, enabling high electron mobility. For example, sheet densities in the 2DEG 140 of a AlGaN/GaN HEMT can exceed $10^{13}$ $cm^{-2}$. The high carrier concentration and high electron mobility in the 2DEG 140 create a large transconductance, yielding high performance for the HEMT at high frequencies. Such performance may be particularly useful, for example, for use in RF applications. Thus, in some useful embodiments, the transistor 18 may be comprised in an RF Doherty amplifier.

The barrier layer 150 may comprise doping 160 of an n-type material within implant regions of its upper surface to facilitate electric connectivity between the barrier layer 150 and a plurality of contacts that are laterally spaced apart from each other and formed on the barrier layer 150. The contacts may include a drain contact 1005 and a gate contact 1010, for example. The material of the gate contact 1010 may be chosen based on the composition of the barrier layer 150 and may, in some embodiments, be a Schottky contact.

A source contact 1015 may also be formed on the barrier layer 150 opposite the drain contact 1005 relative to the gate contact 1010. The source contact 1015 may be coupled to a reference signal such as, for example, a ground voltage. The coupling to the reference signal can be provided by a via 1025 that extends from a lower surface of the substrate 110 through the substrate 1022 (as well as any intermediate layers) to an upper surface of the barrier layer 150. The via 1025 may expose a bottom surface of the ohmic portion 1015*a* of the source contact 1015. In this way, a signal coupled to a backmetal layer 1035 beneath the substrate 110 may be electrically connected to the source contact 1015.

The transistor 18 may include a first insulating layer 1050 and a second insulating layer 1055. The first insulating layer 1050 may contact the upper surface of the barrier layer 150). The second insulating layer 1055 may be formed on the first insulating layer 1050. It will also be appreciated that more than two insulating layers may be included in some embodiments. The first insulating layer 1050 and the second insulating layer 1055 may serve as passivation layers for the transistor 18.

The source contact 1015, the drain contact 1005, and the gate contact 1010 may be formed in the first insulating layer 1050. In some embodiments, at least a portion of the gate contact 1010 is on the first insulating layer 1050. In some embodiments, the gate contact 1010 can be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 1055 may be formed on the first insulating layer 1050 and on portions of the drain contact 1005, gate contact 1010, and source contact 1015.

In some embodiments, field plates 1060 are formed on the second insulating layer 1055. At least a portion of a field plate 1060 may be on the gate contact 1010. At least a portion of the field plate 1060 may be on a portion of the second insulating layer 1055 that is between the gate contact 1010 and the drain contact 1005. Field plates and techniques for forming field plates are discussed, by way of example, in U.S. Pat. No. 8,120,064, the disclosure of which is hereby incorporated herein in its entirety by reference.

Metal contacts 1065 may be disposed in the second insulating layer 1055. The metal contacts 1065 can provide interconnection between the drain contact 1005, gate contact 1010, and source contact 1015 and other parts of the amplifier 18. Respective ones of the metal contacts 1065 may directly contact respective ones of the drain contact 1005 and/or source contact 1015.

The Group III nitride material in the first and second amplifiers 18*a*, 18*b* have different epitaxial structures in at least one respect. Depending on the embodiment, the different epitaxial structure can be in the form of: different numbers of layers; different epitaxial layers, such as corresponding layers with different compositions (e.g., barrier layers with AlGaN layers with 25% Al versus barrier layer with AlGaN layer of 35% Al), different doping levels and/or, different thicknesses; different polarity devices, such as N-polar GaN versus Ga-polar GaN; Different doping levels, gradings and/or profiles; different implantation regions, levels, depths and/or profiles. Different epitaxial structures do not include variations based on manufacturing tolerances, such as plus or minus 10%.

FIG. 3B schematically illustrates another example cross section of a transistor 18 according to one or more embodiments of the present disclosure. The epitaxial structure of the Group III nitride material (in this example, AlGaN) in the transistor 18 of FIG. 3B is different from that of FIG. 3A. In this particular example, the thicknesses of layers are different. Further, although not illustrated in the figures, the alloy concentrations within the barrier layer 150 may be different in some embodiments. Additionally or alternatively, the Group III nitride materials of the first and second amplifiers 18*a*, 18*b* may be different. In one such example, one of the amplifiers may comprise AlGaN and the other may comprise AlN.

Additionally or alternatively, the doping 160 in the barrier layer may be different. In the example of FIG. 3B, the barrier layer 150 and part of the channel layer 130 comprise doping 160 (e.g., using an n-type dopant) to enhance conductivity. In contrast to the relatively shallow doped region of FIG. 3A, the doping 160 in FIG. 3B extends into the channel layer 130 and includes the 2DEG 140 formed at the heterojunction of the channel layer 130 and barrier layer 150.

The epitaxial structure of the first transistor 18*a* and second transistor 18*b* may additionally or alternatively vary in other ways. For example, the Group III nitride material of the first and second transistors 18*a*, 18*b* may have different crystal orientations. In one such example, the AlGaN of the barrier layers 130 of the amplifiers 18*a*, 18*b* have different polarities (e.g., GaN-polar, Nitrogen-polar, semipolar, nonpolar). Additionally or alternatively, the Group Ill nitride material of the first and second transistors 18*a*, 18*b* may have different polytypes (e.g., 3C, 2H, 4H, 6H).

Due to the different epitaxial structures of the transistors 18*a*, 18*b*, the transistors 18*a*, 18*b* have properties that are different from each other. This, for example, enables the main amplifier to be designed with properties that are advantageous for amplifying signal relatively continuously whereas the peaking amplifier may be designed with properties that are advantageous when amplifying peaks.

For example, a Doherty amplifier 10 is often able to operate efficiently because the main amplifier may be used to provide, on its own, an appropriate amount of gain for operation a significant portion of the time and operate the additional peaking amplifier circuitry only when required. Under such circumstances, given that the main amplifier is configured to amplify signal on a generally continuous basis, the main amplifier may have more demanding thermal dissipation requirements than the less frequently operated peaking amplifier.

In view of these potential thermal constraints, embodiments of the present disclosure may include a main amplifier that has a lower power density than the peaking amplifier. Additionally or alternatively, the main amplifier may occupy more space than the peaking amplifier. Such features may, e.g., reduce thermal management requirements by enabling more aggressive heat dissipation of the main amplifier relative to the peaking amplifier. For example, by using a main amplifier that has less concentrated heat accumulation and/or increased surface contact with the heat sink 94, heat may be effectively dissipated despite the generally constant operation of the main amplifier.

In contrast, given that the peaking amplifier is configured to amplify signal on a more intermittent basis, the peaking amplifier may have lower thermal management needs. Accordingly, the peaking amplifier may have a higher power density and/or occupy less space relative to the main amplifier. By occupying less space and/or having a higher power density, the peaking amplifier may require less material to operate and, correspondingly, be cheaper to manufacture, among other benefits.

Another difference between the epitaxial structure of the main amplifier relative to the peaking amplifier in some embodiments may be that the epitaxial structure of the main amplifier provides the main amplifier with a higher gain than the epitaxial structure of the peaking amplifier. This may be advantageous given that the main amplifier may be generally responsible for providing all of the gain of the output signal at least some of the time, whereas the peaking amplifier is only responsible for providing an amount of gain that enhances peaks above what is already provided by the main amplifier.

Yet another difference between the epitaxial structure of the main amplifier relative to the peaking amplifier of some embodiments includes the epitaxial structure of the main amplifier providing the main amplifier with a higher transconductance than the epitaxial structure of the peaking amplifier. In general, the larger the transconductance of a device, the greater the gain the device can deliver (all other factors being constant). Thus, the higher transconductance enabled by the epitaxial structure of the main amplifier may be used to achieve the aforementioned higher gain, in some embodiments.

Another difference between the epitaxial structure of the main amplifier relative to the peaking amplifier of some embodiments includes the epitaxial structure of the peaking amplifier enabling the peaking amplifier to have a higher maximum current than the epitaxial structure of the main amplifier. Indeed, particular embodiments of the peaking amplifier may have anywhere from 1.2 to 4 times as much maximum current capability relative to the main amplifier due to the differences in epitaxial structure. In some embodiments, this higher maximum current works in concert with the aforementioned greater power density, e.g., by having a more compact design that presents less electrical resistance.

Additionally or alternatively, the epitaxial structure of the main amplifier may provide the main amplifier with more linear amplification than the epitaxial structure of the peaking amplifier. Generally speaking, the more linear the amplification, the less efficient the amplifier. In this regard, the main amplifier may offer more linearity, whereas the peaking amplifier may offer efficient operation when required. By operating in concert, the main and peaking amplifiers may strike an advantageous balance between output linearity and efficiency.

According to particular embodiments, the Group III nitride material of the amplifiers 18*a*, 18*b* is Gallium Nitride (GaN). The epitaxial structure of each amplifier 18*a*, 18*b* may have any appropriate polytype. That said, in some embodiments, the epitaxial structure of the amplifiers may be of different polytypes. For example, in some embodiments, the epitaxial structure of the main amplifier may be a 3C polytype of the Group III nitride material. Additionally or alternatively, the epitaxial structure of the peaking amplifier may be a 2H polytype of the Group III nitride material.

As noted above, some embodiments of the Doherty amplifier 10 include one or more amplifiers comprising transistors 18 with a AlN interlayer 190 as part of the barrier layer 150. An example of such a transistor 18 is illustrated in FIG. 3C.

A Doherty amplifier 10 in accordance with one or more of the embodiments described herein may be particularly useful in a variety of high performance applications. Such high performance applications may include, for example RF (e.g., in cellular base station radios), aerospace and defense telecommunications, and/or radar, among other things.

FIG. 4 is a top view of an amplifier die 1000 comprising multiple unit cells 1016 (depicted in FIGS. 3*a-c* as transistors 18). Dielectric layers that isolate the various conductive elements of the top-side metallization layer 180 from each other are not shown in FIG. 4 to simplify the drawing.

In order to increase the output power and current handling capabilities and as mentioned above with respect to FIGS. 3A-C, the transistors 18 are implemented in a "unit cell" configuration in which a large number of individual "unit cell" transistors 18 are arranged electrically in parallel. The transistor 18 may be implemented as a single "die" comprising many unit cells.

As shown in FIG. 4, the amplifier die 1000 comprises a plurality of unit cell transistors 1016 (shown in cross-section as transistors 18 in FIGS. 3*a-c*) that each include a gate finger 1052, a drain finger 1054 and a source finger 1056. The gate fingers 1052 are electrically connected to a common gate bus 1046, and the drain fingers 1054 are electrically connected to a common drain bus 1048. The gate bus 1046 is electrically connected to the gate terminal 1042 (e.g., through a conductive via that extends upwardly from the gate bus 1046) which is implemented as a gate bond pad, and the drain bus 1048 is electrically connected to the drain terminal 1044 (e.g., through a conductive via that extends upwardly from the drain bus 1048) which is implemented as a drain bond pad. The source fingers 1056 are electrically connected to the source terminal via a plurality of conductive source vias 1066 that extend through the semiconductor layer structure 1030. The conductive source vias 1066 may comprise metal-plated vias that extend completely through the semiconductor layer structure 1030.

Figure 5:
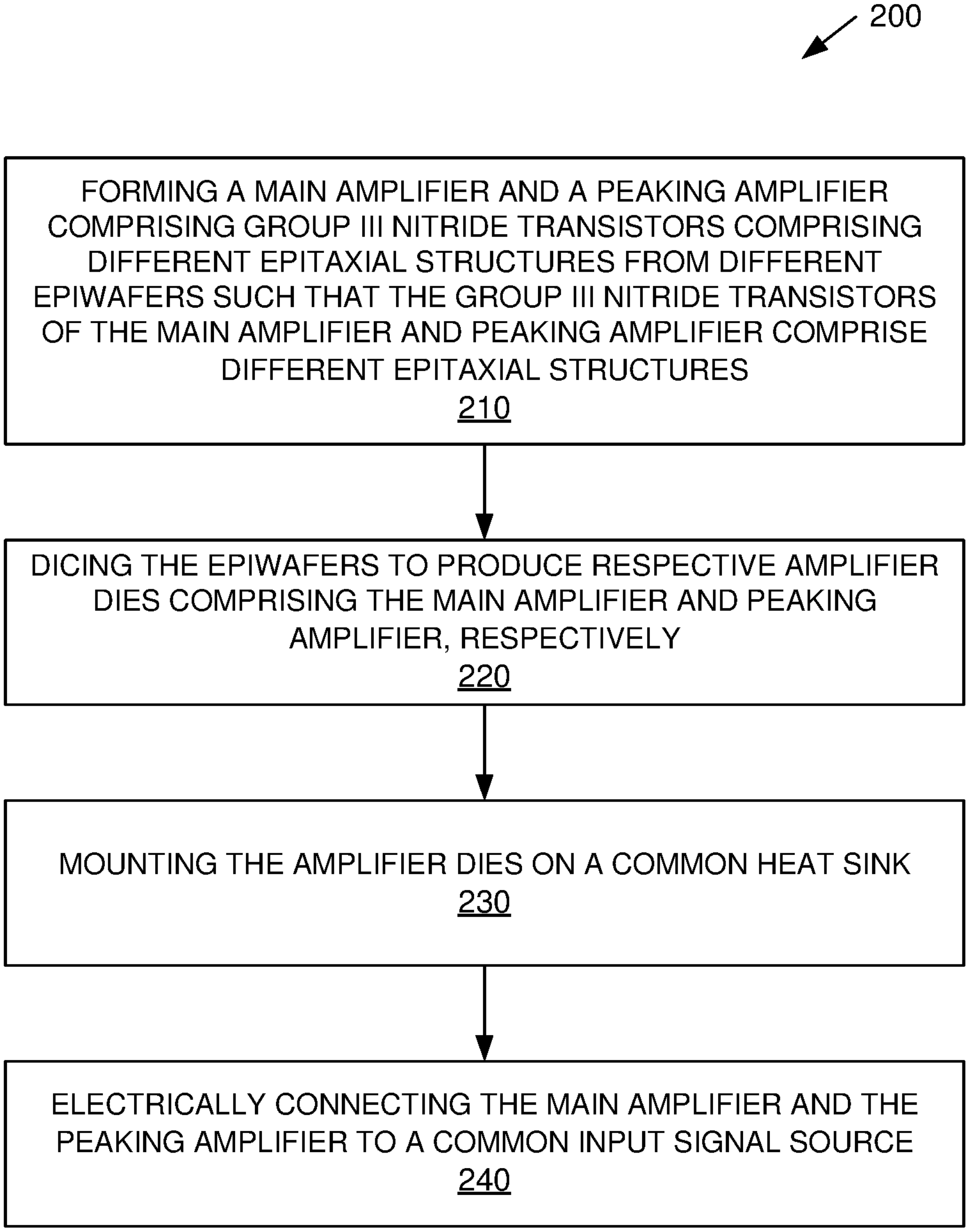
FIG. 5 is a flow diagram illustrating a method of forming a Doherty amplifier, according to one or more embodiments of the present disclosure.

Consistent with the above, FIG. 5 illustrates a method 200 of forming a Doherty amplifier 10. As shown in FIG. 5, the method 200 comprises forming a main amplifier and a peaking amplifier comprising Group III nitride transistors comprising different epitaxial structures from different epiwafers such that the Group III nitride transistors of the main amplifier and peaking amplifier comprise different epitaxial structures (block 210). The method 200 further comprises dicing the epiwafers to produce respective amplifier dies 1000 comprising the main amplifier and peaking amplifier of Group III nitride transistors with different epitaxial structures, respectively (block 220). The method 200 further comprises mounting the amplifier dies 1000 on a common heat sink 94 (block 230). The method 200 further comprises electrically connecting the main amplifier and the peaking amplifier to a common RF input signal source (block 240). The main and peaking amplifiers, and the epitaxial structures thereof, may have any of the attributes or features described above. It should be understood that the main amplifier comprises a first Group III-nitride transistor comprising a first epitaxial structure, and that the main amplifier can comprise multiple transistor stages. The peaking amplifier comprises a second Group III-nitride transistor comprising a second epitaxial structure different from the first epitaxial structure, and the peaking amplifier can comprise multiple transistor stages. Additional peaking paths are possible.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein. Although steps of various processes or methods described herein may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention.

What is claimed is:

1. A Doherty amplifier comprising:

a main amplifier and a peaking amplifier that are electrically connected to a same input signal source and comprise different epitaxial structures of a Group Ill nitride material, such that:

the epitaxial structure of the peaking amplifier provides the peaking amplifier with a higher power density than the epitaxial structure of the main amplifier; and/or the epitaxial structure of the main amplifier provides the main amplifier with a higher gain than the epitaxial structure of the peaking amplifier; and/or the epitaxial structure of the main amplifier provides the main amplifier with a higher transconductance than the epitaxial structure of the peaking amplifier; and/or the epitaxial structure of the peaking amplifier enables the peaking amplifier to have a higher maximum current than the epitaxial structure of the main amplifier; and/or the epitaxial structure of the main amplifier provides the main amplifier with more linear amplification than the epitaxial structure of the peaking amplifier; and/or the epitaxial structure of the main amplifier and the peaking amplifier comprise different polarities.

2. The Doherty amplifier of claim 1, wherein the Group III nitride material comprises Aluminum Gallium Nitride (AlGaN).

3. The Doherty amplifier of claim 1, wherein:

the epitaxial structure of the main amplifier and the peaking amplifier comprise the different polarities; and the different polarities comprise GaN-polar, Nitrogen-polar, and/or semipolar.

4. The Doherty amplifier of claim 1, wherein the main amplifier and/or the peaking amplifier further comprises a dielectric interlayer.

* * * * *